(12) United States Patent
Shemesh et al.

(10) Patent No.: US 7,340,233 B2
(45) Date of Patent: Mar. 4, 2008

(54) INTEGRATED CIRCUIT AND METHODS FOR THIRD SUB HARMONIC UP CONVERSION AND DOWN CONVERSION OF SIGNALS

(75) Inventors: Yair Shemesh, Haifa (IL); Shai Gross, Haifa (IL); Tzvi Maimon, Givat Avni (IL)

(73) Assignee: Intel Corporation, Santa Clara ( * ) Notice: Subject to any disclaimer, the term of this patent is extended or adjusted under 35 U.S.C. 154(b) by 560 days.

(21) Appl. No.: 10/810,685

(22) Filed: Mar. 29, 2004

(65) Prior Publication Data
US 2005/0215215 A1 Sep. 29, 2005

(51) Int. Cl.
H04B 1/16 (2006.01)

(52) U.S. Cl. .............. 455/216; 455/207; 455/209; 455/323; 455/189.1; 327/116; 327/119; 327/355

(58) Field of Classification Search .......... 455/209, 455/207, 76, 561, 550.1, 575.1, 424, 425, 455/456.5, 456.6, 63.1, 114.2, 196.1, 334, 455/208, 315, 313, 314, 326, 318, 216, 323, 455/255, 324, 190.1, 189.1; 327/113, 116, 327/119, 114, 120, 355, 356, 357, 123, 124, 327/359, 358; 375/327, 359, 374, 316, 356, 375/333, 295, 296, 376, 375, 332; 332/117, 332/112; 370/481, 482; 363/157, 159
See application file for complete search history.

(56) References Cited

U.S. PATENT DOCUMENTS

| | | | | |
|---|---|---|---|---|
| 5,262,735 A | * | 11/1993 | Hashimoto et al. | 331/45 |
| 5,436,938 A | * | 7/1995 | Pigeon | 375/376 |
| 5,446,923 A | * | 8/1995 | Martinson et al. | 455/330 |
| 5,812,939 A | * | 9/1998 | Kohama | 455/78 |
| 5,844,939 A | * | 12/1998 | Scherer et al. | 375/219 |
| 5,898,913 A | * | 4/1999 | Pengelly et al. | 455/321 |
| 6,026,287 A | * | 2/2000 | Puechberty et al. | 455/333 |
| 6,148,181 A | * | 11/2000 | Otaka | 455/86 |
| 6,469,585 B1 | * | 10/2002 | Dai et al. | 331/57 |
| 6,512,408 B2 | * | 1/2003 | Lee et al. | 327/359 |
| 6,529,052 B2 | * | 3/2003 | Wang | 327/120 |
| 6,654,595 B1 | * | 11/2003 | Dexter | 455/323 |
| 6,704,558 B1 | * | 3/2004 | Sorrells et al. | 455/323 |
| 6,801,585 B1 | * | 10/2004 | Nguyen et al. | 375/327 |
| 6,980,787 B1 | * | 12/2005 | Dujmenovic | 455/318 |
| 7,079,596 B1 | * | 7/2006 | Namura | 375/324 |

(Continued)

Primary Examiner—Edward F. Urban
Assistant Examiner—Charles Chow
(74) Attorney, Agent, or Firm—Pearl Cohen Zedek Latzer, LLP

(57) ABSTRACT

An integrated circuit may include a receiver and/or a transmitter that performs third order sub-harmonic conversion. The integrated circuit may include a Gilbert cell active mixer with three or more serially-connected transistors in each of the mixer's four branches. Alternatively, the integrated circuit may include a quad-ring passive resistive mixer with three or more serially-connected transistors in each of the mixer's four branches. Alternatively, the integrated circuit may include a logic circuit and a mixer. The logic circuit may apply logic operations to periodic logic signals having a local frequency and to delayed versions thereof to produce reference signals having a dominant spectral component at three times the local frequency. The mixer may mix input signals with the reference signals to produce output signals having a dominant spectral component at three times the local frequency less a center frequency of the input signals.

18 Claims, 6 Drawing Sheets

U.S. PATENT DOCUMENTS

| | | | |
|---|---|---|---|
| 7,085,548 B1* | 8/2006 | Kluge et al. | 455/323 |
| 7,139,546 B1* | 11/2006 | Petrov et al. | 455/323 |
| 2005/0148310 A1* | 7/2005 | Craninckx | 455/266 |
| 2005/0266821 A1* | 12/2005 | Dombusch | 455/323 |
| 2007/0015471 A1* | 1/2007 | Cook et al. | 455/76 |

* cited by examiner

US 7,340,233 B2

INTEGRATED CIRCUIT AND METHODS FOR THIRD SUB HARMONIC UP CONVERSION AND DOWN CONVERSION OF SIGNALS

BACKGROUND OF THE INVENTION

Communication devices having a direct conversion architecture may include mixers to down convert received radio frequency (RF) signals into baseband (BB) signals, and may include mixers to up convert BB signals into RF signals to be transmitted. With a different conversion architecture, the down conversion is from RF signals to intermediate frequency (IF) signals and then to BB signals, and the up conversion is from BB signals to IF signals into RF signals.

The mixers may use reference signals having a reference frequency similar to the carrier frequency of the received/transmitted RF signal. Generation of the reference signal using a local oscillator (LO) at a local oscillator frequency similar to the carrier frequency may lead to unwanted spurs and direct current (DC) offsets in direct conversion receivers. Therefore, some communication devices include a local oscillator to generate local oscillator signals at approximately one third of the desired reference frequency, and then use a frequency tripler to generate signals at the desired reference frequency from the local oscillator signals. However, a frequency tripler may consume a lot of power and may generate unwanted harmonics. Other communication devices include a square wave local oscillator to generate a local oscillator signal at approximately one third of the desired reference frequency, but the local oscillator signal has low third harmonic content and high content of other components.

Gilbert-cell active mixers are commonly used for fundamental conversion. For example, in down-conversion, the output of the mixer has a dominant spectral component at a frequency given by the difference of the local oscillator frequency and the carrier RF frequency. However, when used for third order sub-harmonic conversion, their loss is very high. In other words, the spectral component at three times the local oscillator frequency less the carrier RF frequency is very low.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

The following description involves differential pairs of signals. Signals having a reference with the suffix "P" are positive signals, and signals having a reference with the suffix "N" are negative signals. Similarly, input/output terminals connected to positive signals are referenced with the suffix "P" and input/output terminals connected to negative signals are referenced with the suffix "N".

Figure 1:
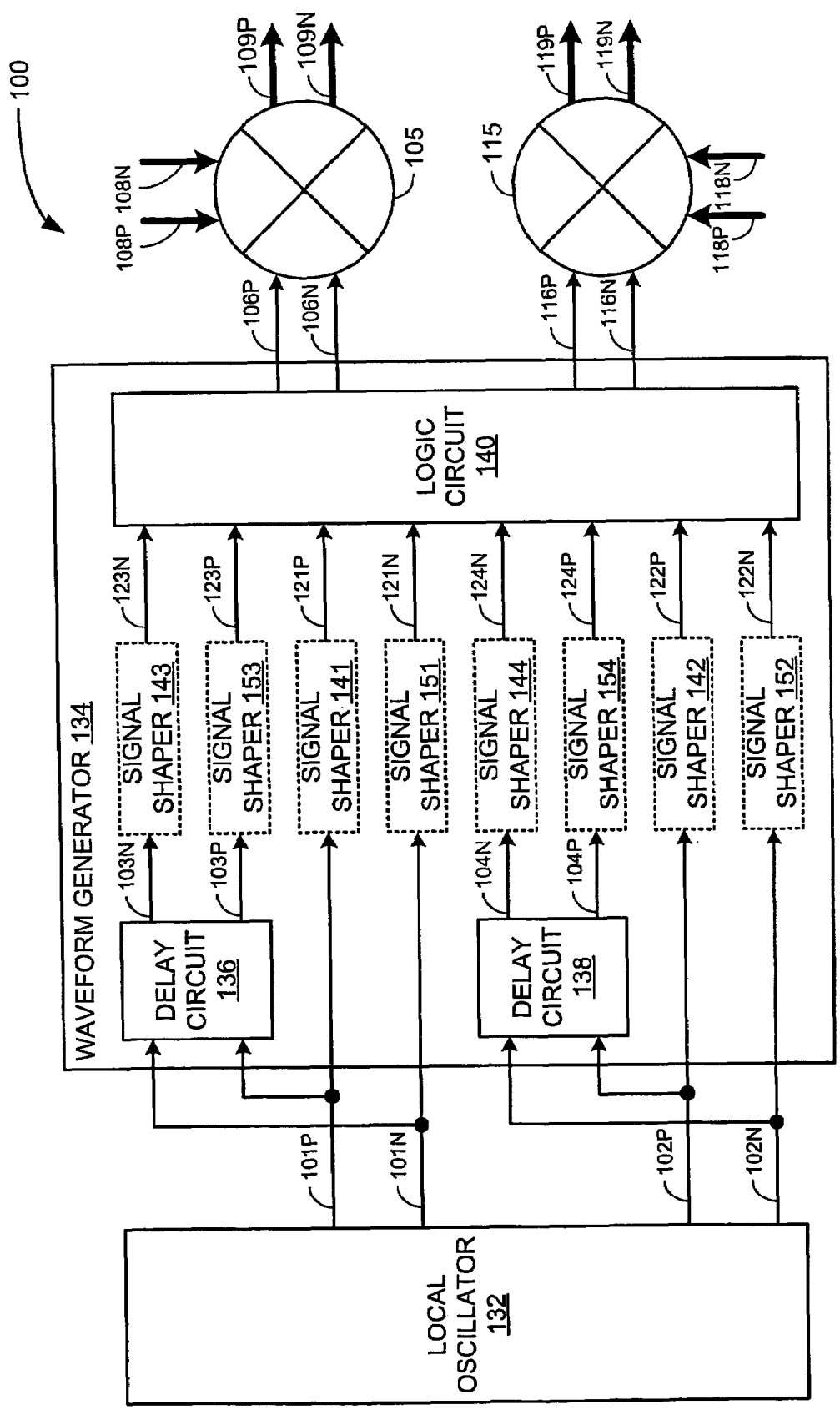
FIG. 1 is a block diagram of an exemplary integrated circuit to mix differential pairs of periodic local frequency signals with respective differential pairs of radio frequency, intermediate frequency or baseband signals, according to some embodiments of the invention.

FIG. 1 is a block diagram of an exemplary integrated circuit 100 according to some embodiments of the invention. Integrated circuit 100 may include a mixer 105 to mix a first differential pair of periodic reference logic signals 106P and 106N with a differential pair of signals 108P and 108N, and to output a differential pair of signals 109P and 109N. Integrated circuit 100 may also include a mixer 115 to mix a second differential pair of period reference logic signals 116P and 116N with a differential pair of signals 118P and 118N, and to output a differential pair of signals 119P and 119N.

Figure 2:
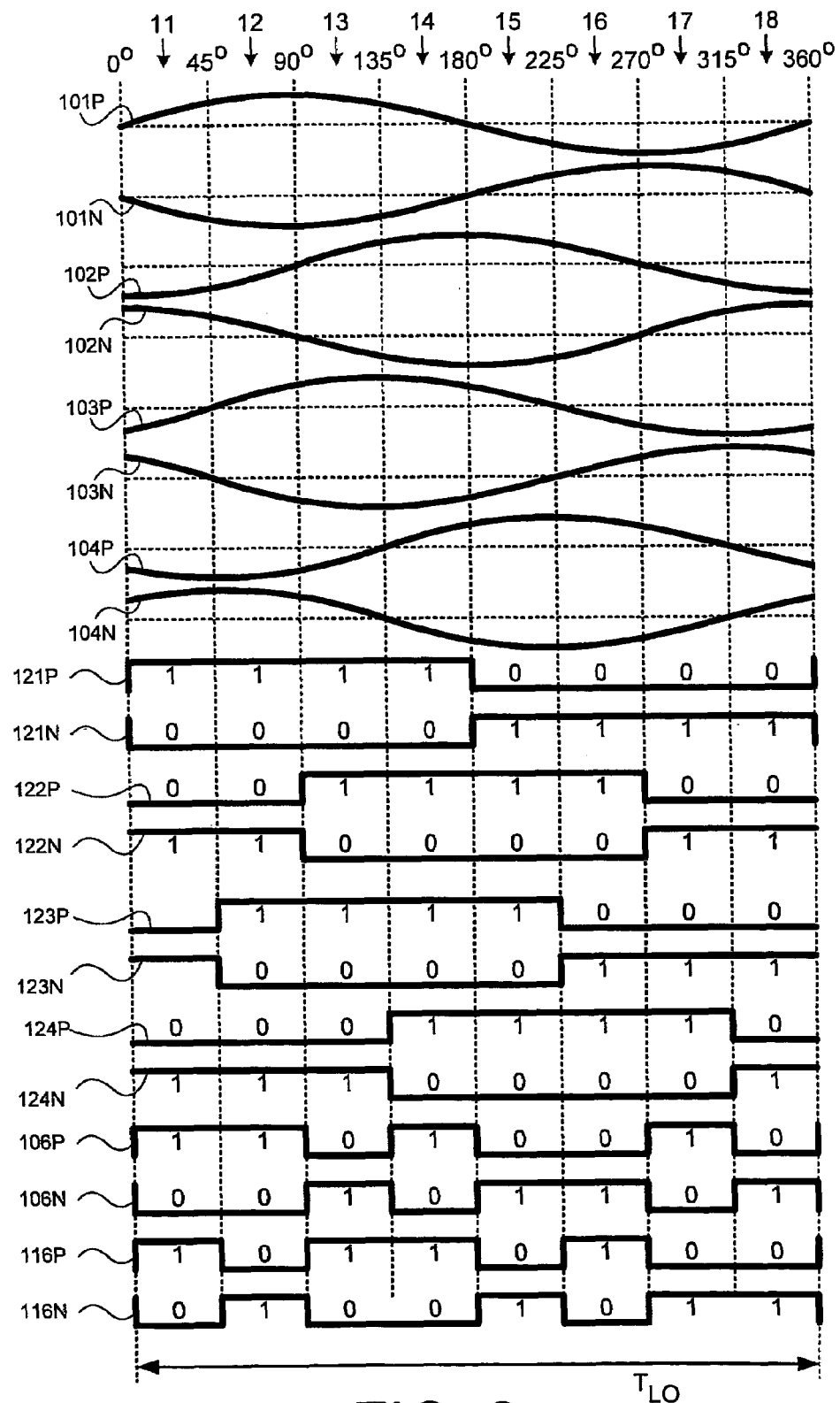
FIG. 2 is a waveform diagram of differential pairs of periodic signals in the integrated circuit of FIG. 1, according to some embodiments of the invention.

Reference is made additionally to FIG. 2, which is a waveform diagram of signals in exemplary integrated circuit 100, according to some embodiments of the invention.

As shown in FIG. 2, signal 106P may have a local frequency $F_{LO}$ and a respective period $T_{LO}$ of $1/F_{LO}$. Period $T_{LO}$ may be partitioned into eight equal consecutive portions 11, 12, 13, 14, 15, 16, 17 and 18 of period $T_{LO}$. For later reference, the beginning of portion 11 may be referred to as "phase 0°" of period $T_{LO}$ and the end of portion 18 may be referred to as "phase 360°" of period $T_{LO}$. Signal 106P may have a logic high value during portions 11, 12, 14 and 17 and a logic low value during portions 13, 15, 16 and 18. Signal 116P may be a copy of signal 106P, delayed by 90°, i.e. by two portions of period $T_{LO}$. Signal 106N may have complimentary logic values to those of signal 106P, and signal 116N may have complimentary logic values to those of signal 116P.

Signals 106P, 106N, 116P and 116N may have spectral components at local frequency $F_{LO}$ and odd harmonics of $F_{LO}$, such as, for example, $3F_{LO}$, $5F_{LO}$ and $7F_{LO}$. Spectral component $3F_{LO}$ may be the dominant spectral component of signals 106P, 106N, 116P and 116N. For example, the coefficient of spectral component $3F_{LO}$ may be approximately 0.512, while the coefficients of spectral components $F_{LO}$, $5F_{LO}$ and $7F_{LO}$ may be approximately 0.264, 0.307 and 0.038, respectively.

In down conversion, signals 108P, 108N, 118P and 118N may be derived from received RF signals and may have a center radio frequency $F_{RF1}$ such as, for example, in the range of approximately 2.4-2.45 gigahertz (GHz), approximately 4.9-5.9 GHz, approximately 10-11 GHz, approximately 14.5 GHz, or approximately 17-18.5 GHz, and local frequency $F_{LO}$ may be substantially one third of $F_{RF1}$, such as, for example, 800 megahertz (MHz), 1.66 GHz or 3.33 GHz, respectively. Consequently, signals 109P, 109N, 119P and 119N may have a dominant spectral component $F_1$, the frequency of which is an intermediate frequency or a baseband frequency, as shown in the following equation:

$$F_1 \approx 3F_{LO} - F_{RF1} \qquad (1)$$

In up conversion, signals 108P, 108N, 118P and 118N may be baseband or intermediate frequency signals and may have a center frequency $F_2$ that is substantially lower than $F_{LO}$. Consequently signals 109P, 109N, 119P and 119N may have a dominant spectral component $F_{RF2}$ at a radio frequency, such as, for example, in the range of approximately 2.4-2.45 gigahertz (GHz), approximately 4.9-5.9 GHz, approximately 10-11 GHz, approximately 14.5 GHz, or approximately 17-18.5 GHz, as shown in the following equation:

$$F_{RF2} \approx 3F_{LO} - F_2 \qquad (2)$$

Integrated circuit 100 may include a local oscillator 132 to generate a differential pair of periodic local oscillator signals 101P and 101N and a differential pair of periodic local oscillator signals 102P and 102N. Integrated circuit 100 may also include a waveform generator 134 to receive local oscillator signals 101P, 101N, 102P and 102N and to generate signals 106P, 106N, 116P and 116N.

As shown in FIG. 2, local oscillator signals 101P, 101N, 102P and 102N may be substantially sinusoidal and may have a duty cycle of substantially 50%. Alternatively, local oscillator signals 101P, 101N, 102P and 102N may have other periodic shapes, or may be logic signals, having alternating high and low values. In addition, local oscillator signal 102P may have a phase delay of substantially 90° from local oscillator signal 101P.

Waveform generator 134 may include a delay circuit 136 to receive local oscillator signals 101P and 101N, to output a signal 103P, which is substantially a replication of local oscillator signal 101P having a phase delay of substantially 45° from local oscillator signal 101P, and to output a signal 103N, which is substantially a replication of local oscillator signal 101N having a phase delay of substantially 45° from local oscillator signal 101N.

Similarly, waveform generator 134 may include a delay circuit 138 to receive local oscillator signals 102P and 102N, to output a signal 104P, which is substantially a replication of local oscillator signal 102P having a phase delay of substantially 45° from local oscillator signal 102P, and to output a signal 104N, which is substantially a replication of local oscillator signal 102N having a phase delay of substantially 45° from local oscillator signal 102N.

If signals 101P, 101N, 102P, 102N, 103P, 103N, 104P and 104N are logic signals, signals 121P, 121N, 122P, 122N, 123P, 123N, 124P and 124N may be respective replications of signals 101P, 101N, 102P, 102N, 103P, 103N, 104P and 104N. However, if signals 101P, 101N, 102P, 102N, 103P, 103N, 104P and 104N are not logic signals, waveform generator 134 may include signal shapers 141, 151, 142, 152, 143, 153, 144 and 154 to respectively convert signals 101P, 101N, 102P, 102N, 103P, 103N, 104P and 104N into logic signals 121P, 121N, 122P, 122N, 123P, 123N, 124P and 124N, respectively.

The conversion method of signal shapers 141, 151, 142, 152, 143, 153, 144 and 154 may be dependent on the shapes of signals 101P, 101N, 102P, 102N, 103P, 103N, 104P and 104N. For example, if signals 101P, 101N, 102P, 102N, 103P, 103N, 104P and 104N are substantially sinusoidal, signal shapers 141, 151, 142, 152, 143, 153, 144 and 154 may convert positive parts of signals 101P, 101N, 102P, 102N, 103P, 103N, 104P and 104N into respective high logic levels and negative parts of signals 101P, 101N, 102P, 102N, 103P, 103N, 104P and 104N into respective low logic levels.

Consequently, signal 121P may have a high logic level during portions 11, 12, 13 and 14 of period $T_{LO}$ and a low logic level during portions 15, 16, 17 and 18. Signal 122P may have a high logic level during portions 13, 14, 15 and 16 and a low logic level during portions 11, 12, 17 and 18. Signal 123P may have a high logic level during portions 12, 13, 14 and 15 and a low logic level during portions 11, 16, 17 and 18. Signal 124P may have a high logic level during portions 14, 15, 16 and 17 and a low logic level during portions 11, 12, 13 and 18.

Signals 121N, 122N, 123N and 124N may have complimentary logic levels to those of signals 121P, 122P, 123P and 124P, respectively.

Waveform generator 134 may include a logic circuit 140 to receive logic signals 121P, 121N, 122P, 122N, 123P, 123N, 124P and 124N and to generate signals 106P, 106N, 116P and 116N. Logic circuit 140 may be implemented, for example, using XOR logic gates and OR logic gates.

Figure 3:
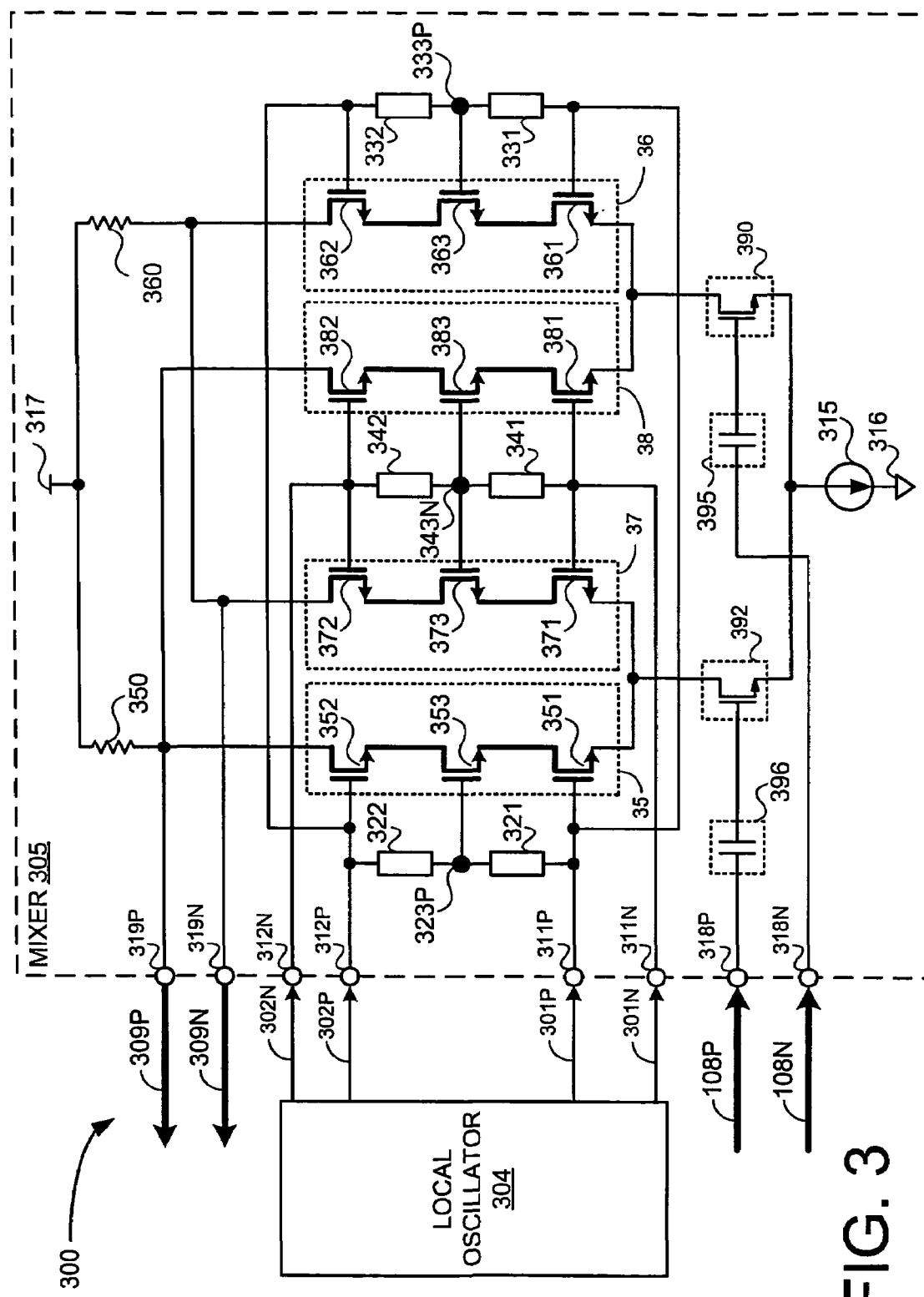
FIG. 3 is a block diagram of an exemplary integrated circuit having a local oscillator and a mixer, according to some embodiments of the invention.

FIG. 3 is a block diagram of an exemplary integrated circuit 300 including a local oscillator 304 and a mixer 305, according to some embodiments of the invention.

Local oscillator 304 may generate differential pairs of substantially sinusoidal local oscillator signals 301P, 301N and 302P, 302N having a local frequency $F_{LO}$, where the suffixes "P" and "W" denotes a positive signal and a negative signal, respectively. Local oscillator signal 301P may have a phase delay of substantially 90° from local oscillator signal 302P.

According to some embodiments of the invention, as shown in FIG. 3, mixer 305 may have input terminals 311P and 311N to receive signals 301P and 301N, respectively, and may have input terminals 312P and 312N to receive signals 302P and 302N, respectively. According to other embodiments of the invention (not shown), input terminals 312P and 312N may receive signals 301P and 301N, respectively, and input terminals 311P and 311N may receive signals 302P and 302N, respectively.

Mixer 305 may have input terminals 318P and 318N to receive signals 108P and 108N, respectively, and may have output terminals 319P and 319N to output a differential pair of signals 309P and 309N, respectively.

For the down conversion example in which signals 108P and 108N have a center radio frequency $F_{RF1}$, signals 309P and 309N may have a dominant spectral component $F_1$ as given above in equation (1), even though none of the differential pairs of local oscillator signals 301P, 301N and 302P, 302N has a significant spectral component at $3F_{LO}$. Similarly, for the up conversion example in which signals 108P and 108N have a center frequency $F_2$, signals 309P and 309N may have a dominant spectral component $F_{RF2}$ as given above in equation (2), even though none of the differential pairs of local oscillator signals 301P, 301N and 302P, 302N has a significant spectral component at $3F_{LO}$.

The topology of mixer 305 is similar to that of a Gilbert cell active mixer. Unlike conventional Gilbert cell active mixers, mixer 305 has groups of three serially connected transistors in each of its four branches. Mixer 305 may have a current source 315, coupled to a ground connection 316, that sets the DC current for the entire mixer. Current source 315 may be replaced by a direct ground connection to save its voltage drop. Mixer 305 may also include a voltage supply 317.

In particular, a first branch 35 of mixer 305 may include a group of serially connected N-Channel transistors (TR) 351, 352 and 353 (i.e. the source of TR 352 is connected to the drain of TR 353 and the source of TR 353 is connected to the drain of TR 351). The drain of TR 352 may be connected to voltage supply 317 through a resistive element 350.

A second branch 36 of mixer 305 may include a group of serially connected N-Channel transistors 361, 362 and 363 (i.e. the source of TR 362 is connected to the drain of TR 363 and the source of TR 363 is connected to the drain of TR 361). The drain of TR 362 may be connected to voltage supply 317 through a resistive element 360.

The gates of transistors 351 and 361 may be fed by input terminal 311P, while the gates of transistors 352 and 362 may be fed by input terminal 312P, so that the signal fed to the gates of transistors 351 and 361 has a phase delay of substantially 90° from the signal fed to the gates of transistors 352 and 362.

A third branch 37 of mixer 305 may include a group of serially connected N-Channel transistors 371, 372 and 373 (i.e. the drain of TR 371 is connected to the source of TR 373 and the drain of TR 373 may be connected to the source of TR 372). The drain of TR 372 may be connected to output terminal 319N.

A fourth branch 38 of mixer 305 may include a group of serially connected N-Channel transistors 381, 382 and 383 (i.e. the drain of TR 381 is connected to the source of TR 383 and the drain of TR 383 is connected to the source of TR 382). The drain of TR 382 may be connected to output terminal 319P.

The gates of transistors 371 and 381 may be fed by input terminal 311N, while the gates of transistors 372 and 382 may be fed by input terminal 312N, so that the signal fed to the gates of transistors 371 and 381 has a phase delay of substantially 90° from the signal fed to the gates of transistors 372 and 382.

Mixer 305 may include passive elements 321, 322, 331, 332, 341 and 342. In one embodiment, passive elements 321, 322, 331, 332, 341 and 342 have resistive characteristics, with the resistance of passive elements 341 and 342 being substantially half the resistance of passive elements 321, 322, 331 and 332. In another embodiment, passive elements 321, 322, 331, 332, 341 and 342 have capacitive characteristics, with the capacitance of passive elements 341 and 342 being substantially double the capacitance of passive elements 321, 322, 331 and 332.

Passive elements 321 and 331 may both be connected to input terminal 311P, while passive elements 322 and 332 may both be connected to input terminal 312P.

Passive element 341 may be connected to input terminal 311N, while passive element 342 may be connected to input terminal 312N.

Therefore, passive elements 321 and 322 act as voltage dividers and create a node 323P therebetween that is connected to the gate of transistor 353. Similarly, passive elements 331 and 332 act as voltage dividers and create a node 333P therebetween that is connected to the gate of transistor 363. The signal at node 333P may be similar or substantially identical to the signal at node 323P.

The gates of transistors 373 and 383 and passive elements 341 and 342 may be connected together at a node 343N.

The signals at nodes 333P and 343N are a first differential pair of mixer signals, and the signals at nodes 323P and 343N are a second differential pair of mixer signals. The phase difference of the differential pairs of mixer signals relative to the signals at input terminals 312P and 312N is substantially half the phase difference of the signals at input terminals 311P and 311N relative to the signals at input terminals 312P and 312N. The phase difference of the differential pairs of mixer signals is substantially 45° relative to signals 302P and 302N, regardless which pair of input terminals is connected to signals 302P and 302N.

Feeding the gates of three transistors with signals at phase differences of substantially 45° may reduce the $1^{st}$ and $2^{nd}$ harmonic content of the switched current in the transistor, and may therefore emphasize the $3^{rd}$ harmonic of the local oscillator signal.

In the embodiment where the passive elements are capacitive elements, alternating current (AC) coupling to the gates of transistors 353, 363, 373 and 383 is enabled. DC biasing of the gates of transistors 353, 363, 373 and 383 is required.

In the embodiment where the passive elements are resistive elements, the gates of transistors 353, 363, 373 and 383 are DC connected to transistors 351, 352, 361, 362, 371, 372 and 381, 382 respectively by substantially equal resistors, and there is no DC current at the gates of transistors 353, 363, 373 and 383. Consequently, the DC level of transistors 353, 363, 373 and 383 is set to be the mean of the respective other two transistors and this is a good bias point for the middle transistor.

According to some embodiments of the invention, the source of TR 381 and the drain of TR 361 may be connected to the drain of an optional N-Channel transistor 390, and the source of TR 371 and the drain of TR 351 may be connected to source of an optional N-Channel transistor 392. The source of TR 390 and the drain of TR 392 may be connected together through current source 315 to ground connection 316. In addition, the gate of TR 390 may be connected to input terminal 318N, and the gate of TR 392 may be connected to input terminal 318P.

According to other embodiments of the invention, the sources of TR 371 and TR 381 and the drains of TR 351 and TR 361 may be connected together to current source 315. In addition, the gate of TR 270 may be connected to input terminal 318N through an optional capacitor 395 and the gate of TR 272 may be connected to input terminal 318P through an optional capacitor 396.

Figure 4:
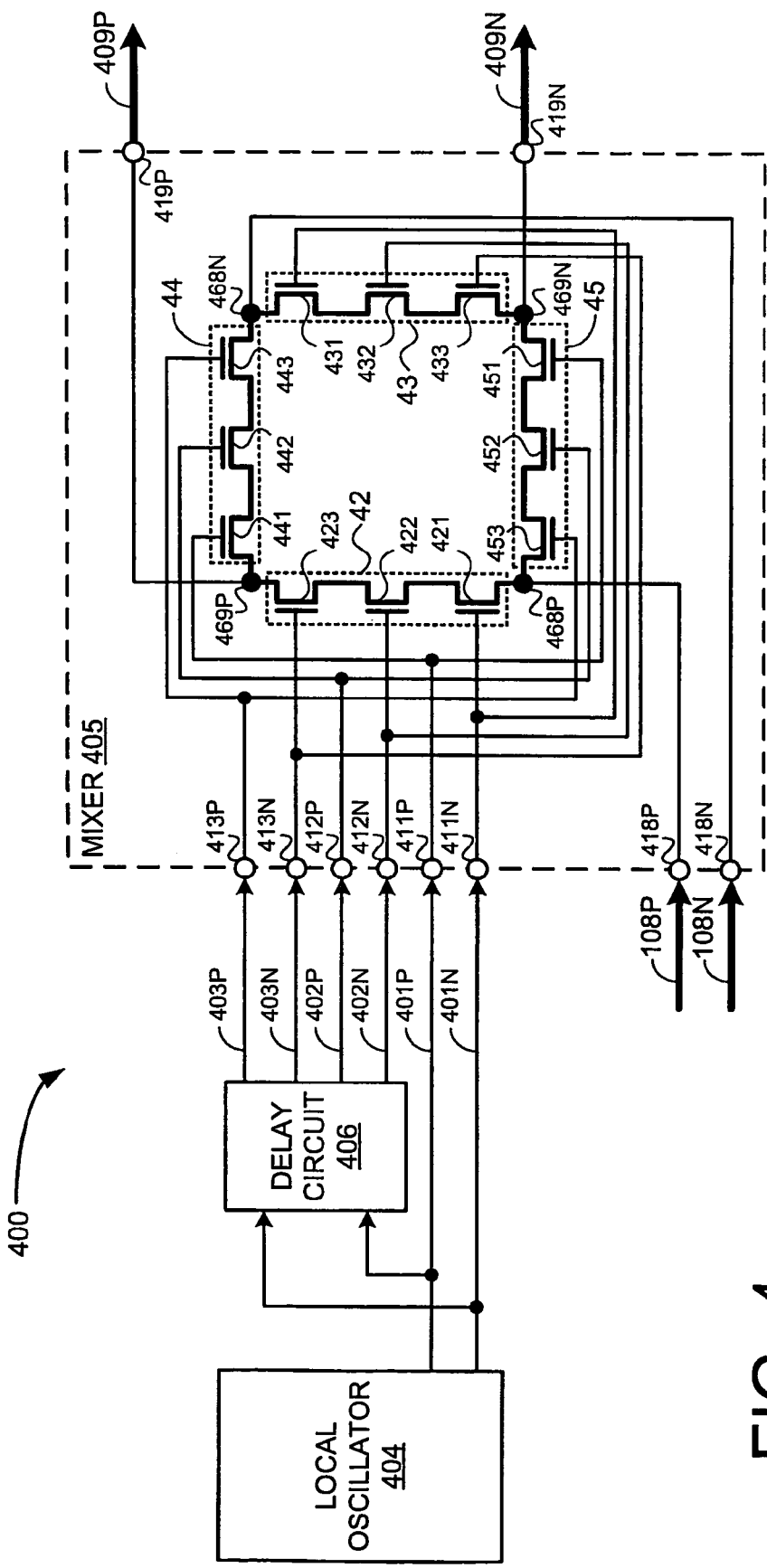
FIG. 4 is a block diagram of an exemplary integrated circuit having a local oscillator and another mixer, according to some embodiments of the invention.

FIG. 4 is a block diagram of an exemplary integrated circuit 400 including a local oscillator 404 and a mixer 405, according to some embodiments of the invention.

Local oscillator 404 may generate a differential pair of periodic substantially sinusoidal local oscillator signals 401P and 401N having a local frequency $F_{LO}$, respectively. Integrated circuit 400 may include a delay circuit 406 to generate from signals 401P and 401N delayed versions thereof, such as, for example, signals 402P and 402N and signals 403P and 403N.

Figure 5:
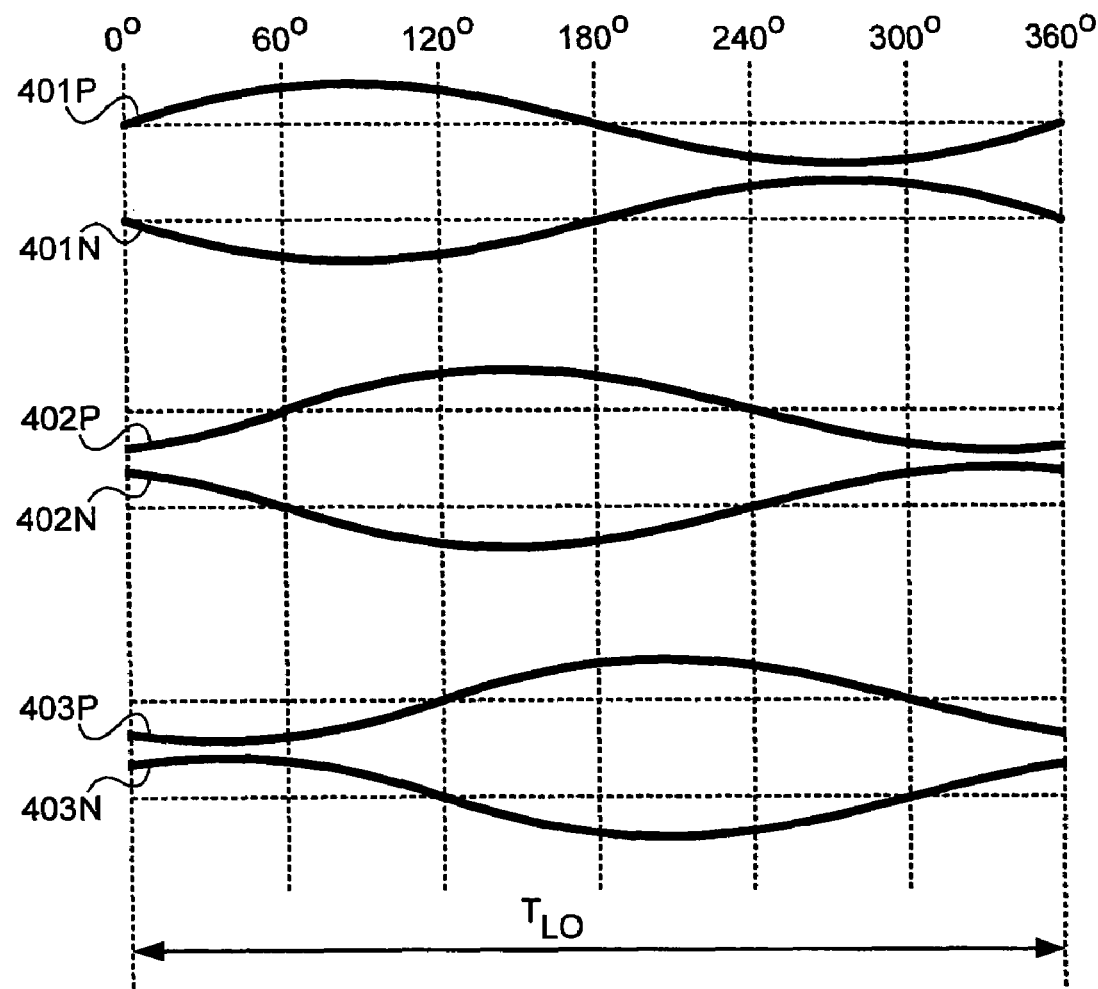
FIG. 5 is a waveform diagram of differential pairs of periodic signals in the integrated circuit of FIG. 4, according to some embodiments of the invention.

Reference is made additionally to FIG. 5, which is a waveform diagram of signals in exemplary integrated circuit 400, according to some embodiments of the invention. Differential pairs of substantially sinusoidal local oscillator signals 401P, 401N and 402P, 402N and 403P, 403N have a period $T_{LO}$ of $1/F_{LO}$. As shown in FIG. 5, signal 402P may have a phase difference of substantially 60° from signal 401P, and signal 403P may have a phase difference of substantially 60° from signal 402P. Alternatively, signal 402P may have a phase difference of substantially −60° from signal 401P, and signal 403P may have a phase difference of substantially −60° from signal 402P.

In alternative embodiments, the three differential pairs of substantially sinusoidal local oscillator signals may be generated in a different manner. For example, local oscillator 404 may generate the delayed differential pairs of local oscillator signals. In another example, two delay circuits may be used.

Mixer 405 may have reference input terminals 411N, 411P, 412N, 412P, 413N, and 413P to receive signals 401N, 401P, 402N, 402P, 403N, and 403P, respectively. Mixer 405 may have input terminals 418P and 418N to receive differential input signals 108P and 108N, respectively, and may have output terminals 419P and 419N to output a differential pair of signals 409P and 409N, respectively.

In the example shown in FIG. 4, mixer 405 is a quad-ring passive resistive mixer. Each branch of the ring includes three stacked transistors, such as, for example, field effect transistors (FETs). All three transistors on each side of the ring are fed with the same local oscillator frequency $F_{LO}$, but with different phase. Opposite sides of the ring are fed with the same signal, while the adjacent sides are fed with the same signals but with opposite phase. One pair of opposite ring nodes serve as the RF differential signal, while the other opposite ring nodes serve as the IF or baseband differential signal.

Each of the three transistors on each of the ring sides is conductive for half of the period $T_{LO}$, but the timing at which the transistor is conductive is different. Since the path on each side is conductive only when all three transistors are conductive, the time during which the path is conductive is shorter than half of the period $T_{LO}$. Therefore the harmonic content of the current in each side of the ring is higher than for a single transistor with a single local oscillator signal.

Consequently, for the down conversion example in which signals 108P and 108N have a center radio frequency $F_{RF1}$, signals 409P and 409N may have a dominant spectral component $F_1$ as given above in equation (1), even though none of the differential pairs of substantially sinusoidal local oscillator signals has a significant spectral component at $3F_{LO}$. Similarly, for the up conversion example in which signals 108P and 108N have a center frequency $F_2$, signals 409P and 409N may have a dominant spectral component $F_{RF2}$ as given above in equation (2), even though none of the differential pairs of substantially sinusoidal local oscillator signals has a significant spectral component at $3F_{LO}$. Signals 409P and 409N may have an insignificant spectral component at approximately $F_{LO}$-$F_1$ or no spectral component at that frequency.

It will be appreciated by persons of ordinary skill in the art that mixer 405 may be modified to create or enhance higher order harmonics.

The internal structure of mixer 405 will now be described in more detail. A first branch 42 of the ring may include stacked transistors 421, 422 and 423, and a second branch 43 of the ring may include stacked transistors 431, 432 and 433. The gates of transistors 421/431, 422/432 and 423/433 may be connected to reference input terminals 411N, 412N and 413N, respectively. A third branch 44 of the ring may include stacked transistors 441, 442 and 443, and a fourth branch 45 of the ring may include stacked transistors 451, 452, and 453. The gates of transistors 441/451, 442/452 and 443/453 may be connected to reference input terminals 411P, 412P and 413P, respectively.

A ring node 468P between transistors 421 and 453 may be connected to input terminal 418P, and an opposite ring node 468N between transistors 431 and 443 may be connected to input terminal 418N. A ring node 469P between transistors 423 and 441 may be connected to output terminal 419P, and an opposite ring node 469N between transistors 433 and 451 may be connected to output terminal 419N.

Figure 6:
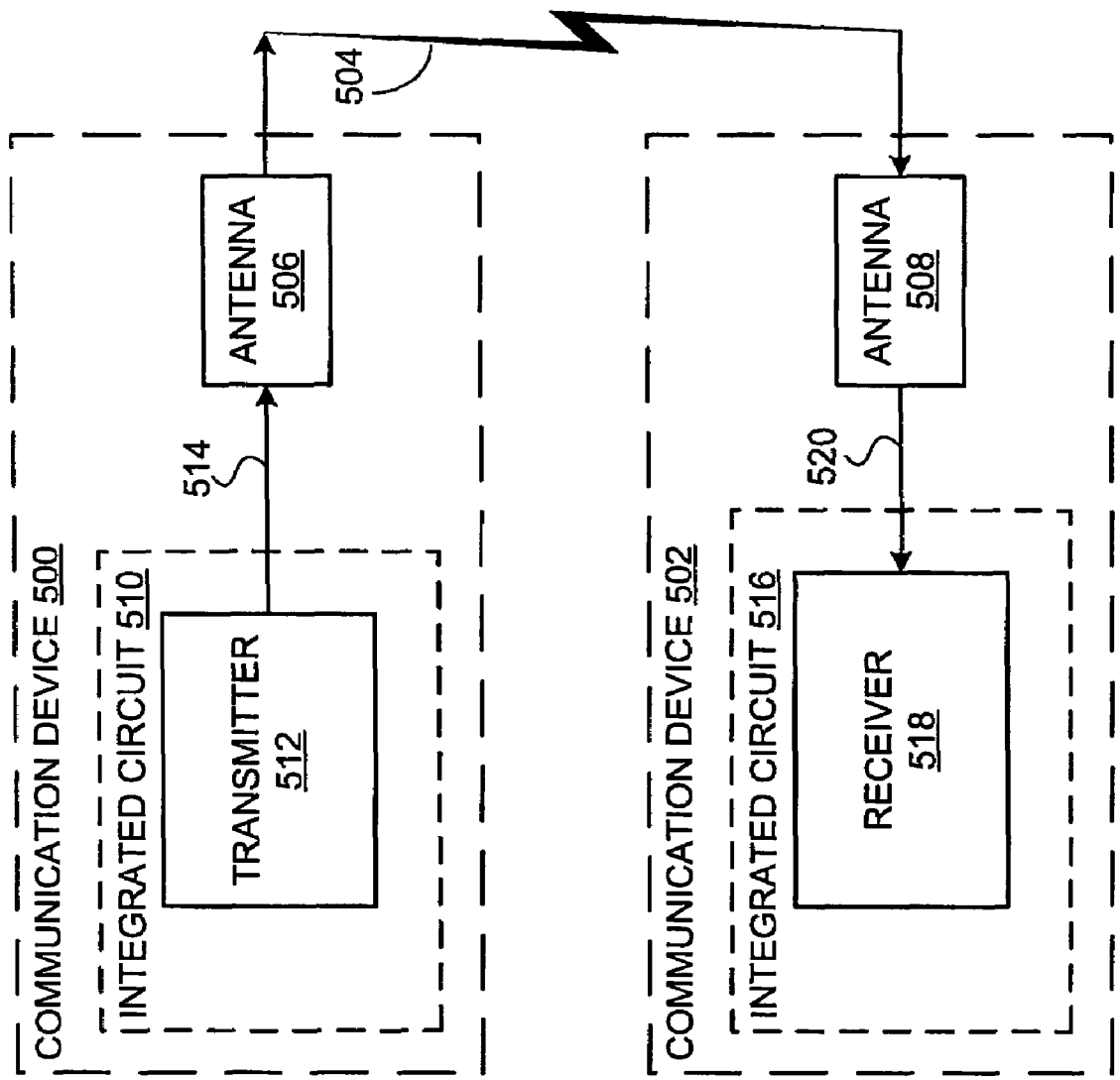
FIG. 6 is a block diagram of a communication system, according to some embodiments of the invention.

FIG. 6 is a block-diagram illustration of an exemplary communication system, in accordance with some embodiments of the present invention. A communication device 500 is able to communicate with a communication device 502 over a communication channel 504.

A transmitter according to embodiments of the invention may be present in either or both of communication devices 500 and 502. A receiver according to embodiments of the invention may be present in either or both of communication devices 500 and 502.

Communication devices 500 and 502 may include antennas 506 and 508, respectively, which may be, for example, monopole antennas, dipole antennas, loop antennas, shot antennas, dual antennas, omni-directional antennas or any other suitable antennas.

Communication device 500 may include an integrated circuit 510 that may include, at least in part, a transmitter 512. Integrated circuit 510 may implement at least one of the circuits described for integrated circuits 100, 300 and 400, or any combination thereof, and may be suitable to up convert BB or IF signals into RF signals. Integrated circuit 510 may output a related RF signal 514 that may then be transmitted by antenna 506 over communication channel 504.

Communication device 502 may include an integrated circuit 516 that may include, at least in part, a receiver 518. Integrated circuit 516 may implement at least one of the circuits described for integrated circuits 100, 300 and 400, or any combination thereof, and may be suitable to down convert RF signals into IF or BB signals. Integrated circuit 516 may receive an RF signal 520 in relation to signal 514 from antenna 506 and may down convert related RF signals into IF or BB signals.

It should be understood that the invention may be used in a variety of applications. Although the present invention is not limited in this respect, the integrated circuits disclosed herein may be used in many communication devices such as the transmitters and receivers of a radio system.

A non-exhaustive list of examples for integrated circuits 100, 300, 400, 510 and 516 includes integrated circuits that include one or more of the following functions, or parts of these functions: a wireless local area network (WLAN) transmitter, a WLAN receiver, a WLAN bridge, a WLAN protocol bridge, a cellular transmitter, a cellular receiver, a cellular bridge.

A non-exhaustive list of examples for communication devices 500 and 502 includes a mobile telephone, a cellular phone, a cellular base station, a WLAN mobile unit, a WLAN stationary unit, a WLAN add-on card, a WLAN personal computer memory card international association (PCMCIA) card, a WLAN personal computer (PC) card, a WLAN switch, a WLAN router, a WLAN server, a BLUETOOTH connected device, a Zigbee wireless communication, a game console, a digital camera, a digital video camera, a television set, a desktop personal computer, a work station, a server computer, a laptop computer, a notebook computer, a hand-held computer, a personal digital assistant (PDA), a very small aperture terminal (VSAT) for voice, internet and television broadcast, and the like.

A non-exhaustive list of examples for types of cellular radiotelephone communication systems intended to be within the scope of the present invention includes Direct Sequence—Code Division Multiple Access (DS-CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, wideband CDMA (WCDMA), General Packet Radio Service (GPRS) systems, Enhanced Data for GSM Evolution (EDGE) systems, 3.5 G and 4 G systems.

A non-exhaustive list of examples for types of WLAN intended to be within the scope of the invention includes WLANs that meet the following standards and/or other existing or future related standards:

ANSI/IEEE standard 802.11 for Wireless LAN Medium Access Control (MAC) and Physical layer (PHY) specifications:
Rev. a for Higher-speed physical layer extension in the 5 GHz band, published 1999,
Rev. b for Higher-speed physical layer extension in the 2.4 GHz band, published 1999,
Rev. g for Higher data rate extension in the 2.4 GHz band, published 2003,
BLUETOOTH™ core specifications v1.2, published by the BLUETOOTH™ special interest group (SIG) November 2003.
IEEE standard draft 802.15.4 for low data rate WLAN, published May 2003

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method for producing a first periodic output signal having a dominant spectral component at three times a local frequency less a first center frequency, from a first periodic signal having the local frequency, delayed versions of the first signal, and a first periodic input signal having the first center frequency, the method comprising:
producing a first periodic logic signal having relatively high spectral content at three times the local frequency and relatively low spectral content at other frequencies, from the first periodic signal and the delayed versions thereof using logic operations, wherein said first logic signal comprises eight periodic sections, and wherein said first, third, fourth, and sixth sections are at a first logic level and said second, fifth, seventh, and eighth sections are at a second logic level opposite said first logic level; and
producing the first periodic output signal by mixing the first periodic input signal with said first logic signal.

2. The method of claim 1, wherein the delayed versions comprise a second periodic signal having a phase of approximately 90 degrees relative to the first periodic signal and a third periodic signal having a phase of approximately 45 degrees relative to the first periodic signal.

3. The method of claim 2, wherein the delayed versions comprise a fourth periodic signal having a phase of approximately 135 degrees relative to the first periodic signal.

4. The method of claim 1, wherein at least one of the group consisting of: the first periodic signal, the delayed versions of the first periodic signal, said first logic signal, the first periodic input signal, and the first periodic output signal is a differential signal.

5. The method of claim 1, comprising:
producing a second periodic logic signal having a phase of approximately 90 degrees relative to the first periodic logic signal, from the first periodic signal and the delayed versions thereof by means of logic operations; and
producing a second periodic output signal having a dominant spectral component at three times the local frequency less a second center frequency by mixing a second periodic input signal having said second center frequency with said second logic signal.

6. The method of claim 1, wherein at least one of the group consisting of: the first periodic signal, the delayed versions of the first periodic signal, said first logic signal, said second logic signal, the first periodic input signal, said second periodic input signal, the first periodic output signal, and said second periodic output signal is a differential signal.

7. The method of claim 1, comprising:
shaping the first periodic signal and the delayed versions thereof into logic signals for producing said first periodic logic signal, wherein the first periodic signal and the delayed versions thereof are substantially sinusoidal signals.

8. The method of claim 1, wherein the first periodic input signal is a radio frequency signal and mixing the first input signal with said first periodic logic signal comprises down converting the first input signal.

9. The method of claim 1, wherein the first periodic output signal is a radio frequency signal and mixing the first input signal with said first periodic logic signal comprises up converting the first input signal.

10. A method for producing a periodic differential output signal having a dominant spectral component at three times a local frequency less a center frequency by mixing three periodic differential signals having the local frequency and a periodic differential input signal having the center frequency in a circuit comprising four branches, wherein each branch comprises three serially connected transistors, and wherein the second signal and the third signal are delayed from the first signal, the method comprising:
receiving a positive portion of the three signals in the first and the second branches, wherein in each branch the first transistor receives the positive portion of the first signal, the second transistor receives the positive portion of the second signal, and the third transistor receives the positive portion of the third signal;
receiving a negative portion of the three signals in the third and the fourth branches, wherein in each branch the first transistor receives the negative portion of the first signal, the second transistor receives the negative portion of the second signal, and the third transistor receives the negative portion of the third signal;
receiving a positive portion of the input signal in a first transistor connected to the first branch and the third branch and a negative portion of the input signal in a second transistor connected to the second branch and the fourth branch; and
producing a positive portion of the output signal from the first branch and the fourth branch and a negative portion of the output signal from the second branch and the third branch.

11. The method of claim 10, wherein the second periodic signal has a phase of approximately 90 degrees relative to the first periodic signal and the third periodic signal has a phase of approximately 45 degrees relative to the first periodic signal.

12. The method of claim 10, wherein the third periodic signal is the average of the first periodic signal and the second periodic signal.

13. The method of claim 10, wherein the periodic input signal is a radio frequency signal and mixing the input signal with the three periodic signals comprises down converting the input signal.

14. The method of claim 10, wherein the periodic output signal is a radio frequency signal and mixing the input signal with the three periodic signals comprises up converting the input signal.

15. A method for producing a periodic differential output signal having a dominant spectral component at three times a local frequency less a center frequency by mixing three periodic differential signals having the local frequency and a periodic differential input signal having the center frequency in a circuit comprising a ring having four branches connected by nodes, wherein each branch comprises three stacked transistors, and wherein the second signal and the third signal are delayed from the first signal, the method comprising:

receiving a positive portion of the three signals in the first branch and the second branch opposite thereto, wherein in each branch the first transistor receives the positive portion of the first signal, the second transistor receives the positive portion of the second signal, and the third transistor receives the positive portion of the third signal;

receiving a negative portion of the three signals in the third branch and the fourth branch opposite thereto, wherein in each branch the first transistor receives the negative portion of the first signal, the second transistor receives the negative portion of the second signal, and the third transistor receives the negative portion of the third signal;

receiving a positive portion of the input signal in the node connecting the second branch and the third branch and a negative portion of the input signal in the node connecting the first branch and the fourth branch; and producing a positive portion of the output signal from the node connecting the first branch and the third branch and a negative portion of the output signal from the node connecting the second branch and the fourth branch.

16. The method of claim 15, wherein the second periodic signal has a phase of approximately 60 degrees relative to the first periodic signal and the third periodic signal has a phase of approximately 120 degrees relative to the first periodic signal.

17. The method of claim 15, wherein the periodic input signal is a radio frequency signal and mixing the input signal with the three periodic signals comprises down converting the input signal.

18. The method of claim 15, wherein the periodic output signal is a radio frequency signal and mixing the input signal with the three periodic signals comprises up converting the input signal.

\* \* \* \* \*